United States Patent [19]
Delahoy et al.

[11] Patent Number: 4,680,616
[45] Date of Patent: Jul. 14, 1987

[54] REMOVAL OF DEFECTS FROM SEMICONDUCTORS

[75] Inventors: Alan E. Delahoy, Rocky Hill; Thomas Tonon, Princeton, both of N.J.

[73] Assignee: Chronar Corp., Princeton, N.J.

[21] Appl. No.: 861,555

[22] Filed: May 9, 1986

[51] Int. Cl.⁴ .................... H01L 31/06; H01L 31/18
[52] U.S. Cl. ........................................ 357/59; 29/572; 29/575; 29/584; 29/585; 136/244; 136/249; 136/258; 136/290; 357/30
[58] Field of Search .................. 148/1.5; 29/575, 584, 29/585, 572; 136/258 AM, 290, 249 TJ, 244; 357/2, 30, 59 C

[56] References Cited

U.S. PATENT DOCUMENTS

| | | | |
|---|---|---|---|
| 4,464,823 | 8/1984 | Izu et al. | 29/572 |
| 4,494,302 | 1/1985 | Knechtli et al. | 29/575 |
| 4,640,002 | 2/1987 | Phillips et al. | 29/574 |

FOREIGN PATENT DOCUMENTS

60-43871  3/1985  Japan .................................. 136/290

OTHER PUBLICATIONS

P. G. Lasswell et al., Conf. Record, 15th IEEE Photovoltaic Specialists Conf., (1981), pp. 1021-1024.

Primary Examiner—Aaron Weisstuch
Attorney, Agent, or Firm—George E. Kersey

[57] ABSTRACT

Removal of defects from semiconductors by applying a reverse bias potential to the semiconductors and irradiating the semiconductors with photon energy greater than their bangap energies.

14 Claims, 4 Drawing Figures

REMOVAL OF DEFECTS FROM SEMICONDUCTORS

This invention relates to the removal of defects from semiconductors, and more particularly to the removal of defects from amorphous semiconductors.

It is known that some semiconductors, such as hydrogenated amorphous silicon, undergo a progressive degradation in their electronic properties upon exposure to light. This was first noted by D. L. Staebler and C. R. Wronski who reported in *Appl. Phys. Lett.*, 31, 292 (1977) that both the dark conductivity and photoconductivity of intrinsic (undoped) amorphous silicon hydride films were significantly lowered by exposure to light. They further observed that the degradation in conductivity is reversible by annealing the films at temperatures in the range from 150 to 200 degrees C. These observations, known as the "Staebler-Wronski" effect, have been attributed to a reversible increase in defects of recombination centers. Since the defects are not permanent and can be healed by annealing, they are termed "metastable".

The healing appears to take place over a spectrum of barrier heights, since annealing activation energies of between 1 and 1.5 eV have been observed, M. Stutzmann, W. B. Jackson, and C. C. Tsai, *Phys. Rev. B*, 32, 23 (1985).

In the case of solar cells prepared from amorphous silicon hydride, light exposure degrades conversion efficiency. Under prolonged illumination, cell efficiency tends to settle at a value where the rate of creation of defects is equal to the rate of thermal annealing of defects that occurs at the operating temperature of the cell. Under high temperature annealing the original efficiency of the cell can be substantially recovered.

It is also known that the metastable defects can be created in solar cells in total darkness by subjecting the cells to forward current flow. This method of defect generation has been termed "current injection".

No method of healing the defects, other than by thermal annealing at relatively high temperatures, has been found previously. As recently as 1984, Professor Helmut Fritzsche of the University of Chicago stated: "The S.W. [Staebler-Wronski] defects can only be removed by annealing." Professor Fritzsche was referring to high-temperature annealing and also observed: "Attempts to quench the defects by infrared [low temperature] annealing have failed." H. Fritzsche, *American Institute of Physics Proceedings*, Number 120, "Optical Effects in Amorphous Semiconductors", Eds. P. C. Taylor and S. G. Bishop (1984), page 480.

A related observation has been made by G. A. Swartz in *Appl. Phys. Lett.*, 44, 697 (1984) who discusses a method of improving the performance of as-deposited P.I.N. cells. Swartz states: "The cell performance was measured after the final fabrication procedure and then after the bias-anneal treatment." This method involves reverse biasing of the cell at relatively high temperatures on the order of 175° C. for 30 minutes, followed by cooling the cell while the bias is maintained. In his Table I, Swartz reports percentage improvements in efficiency from 4 to 18 percent after bias-anneal treatment. There is no discussion on whether the improvement is permanent or transient in nature, nor is there any suggestion that the technique might be applied to degraded, i.e. light-soaked solar cells in the hope of recovering their efficiency.

Accordingly, it is an object of the invention to facilitate the removal of defects from amorphous semiconductor solar cells. Another related object is to achieve defect removal without requiring temperatures on the order of 150° to 200° Centigrade.

Another object of the invention is to achieve defect removal in solar panel arrays where the use of annealing at relatively high temperatures is undesirable, time consuming, and costly.

SUMMARY OF THE INVENTION

In accomplishing the foregoing and related objects, the invention provides for the removal of semiconductor defects by a combination of applied potential and non-thermal irradiation. In particular, metastable defects in amorphous semiconductors, such as silicon hydride, and whether created by light or by current injection, are removed without the need for high temperature annealing of the material.

For definiteness, the semiconductor may be referred to as amorphous silicon hydride (or hydrogenated amorphous silicon, a—Si:H), however it is understood that the invention applies equally to amorphous alloys containing both hydrogen and fluorine (e.g., a—Si:H,F) and similarly to amorphous germanium (a—Ge:H,F) and to silicon-germanium alloys (a—Si,Ge:H,F).

In accordance with one aspect of the invention, the defects are removed by applying a reverse bias and then irradiating with intense visible light at a photon energy greater than the semiconductor bandgap energy.

After a period of time sufficient to achieve the desired degree of defect removal, the light is extinguished and the reverse bias removed. It is surprising that this procedure should result in the healing of defects since it involves illuminating the sample with an intense light source, and illumination generally produces defects instead of removing them.

In accordance with another aspect of the invention the bias is applied before the light and removed only after the light is extinguished. This ensures that at no time is the cell irradiates with intense light while not under bias. To irradiate the cell with intense light and without bias would cause the cell to undergo rapid degradation.

It is speculated that the bias results in a high strength electric field within the I layer of P-I-N type structures which rapidly extracts the photo-generated carriers and thus minimizes their recombination.

Since carrier recombination, particularly in the I layer, is generally acknowledged to be responsible for the creation of new defects, or result in very low efficiency, it is believed that the presence of the applied field, by suppressing recombination, greatly prevents the generation of additional defects. However, this does not account for the observed removal of previously existing defects in accordance with the present invention. This result is not predicted by the extant literature.

Experiments have shown that intense light (for example, infrared) having insufficient energy, e.g. a photon energy less than the energy gap of the semiconductor material, is not effective in removing the defects.

Typically, reverse voltages in accordance with the invention have been up to about −10 volts and the light intensities have been on the order of 50 suns (approximately 5 watts per square centimeter).

DESCRIPTION OF THE DRAWINGS

Other aspects of the invention will become apparent after considering several illustrative embodiments, taken with the drawings, in which.

DETAILED DESCRIPTION

Figure 1:
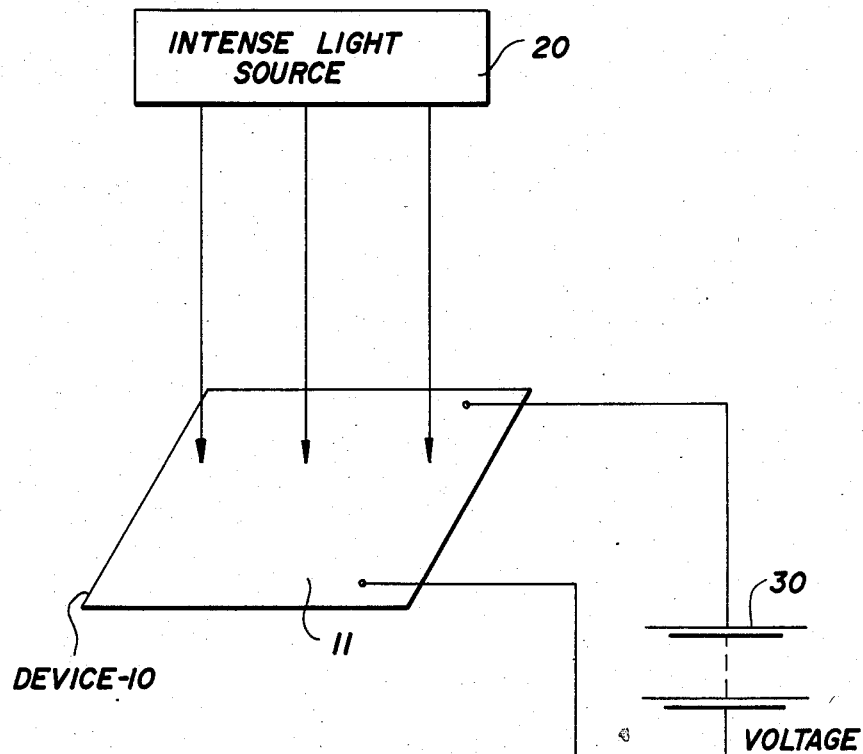
FIG. 1 is a schematic diagram of a defect removal arrangement in accordance with the invention.

In FIG. 1 a semiconductor device 10 is shown under irradiation from a light source 20 and subject to an electric potential from a voltage source 30. The device 10 includes a rectifying junction 11, and the voltage source 30 applies a reverse bias.

Figure 2:
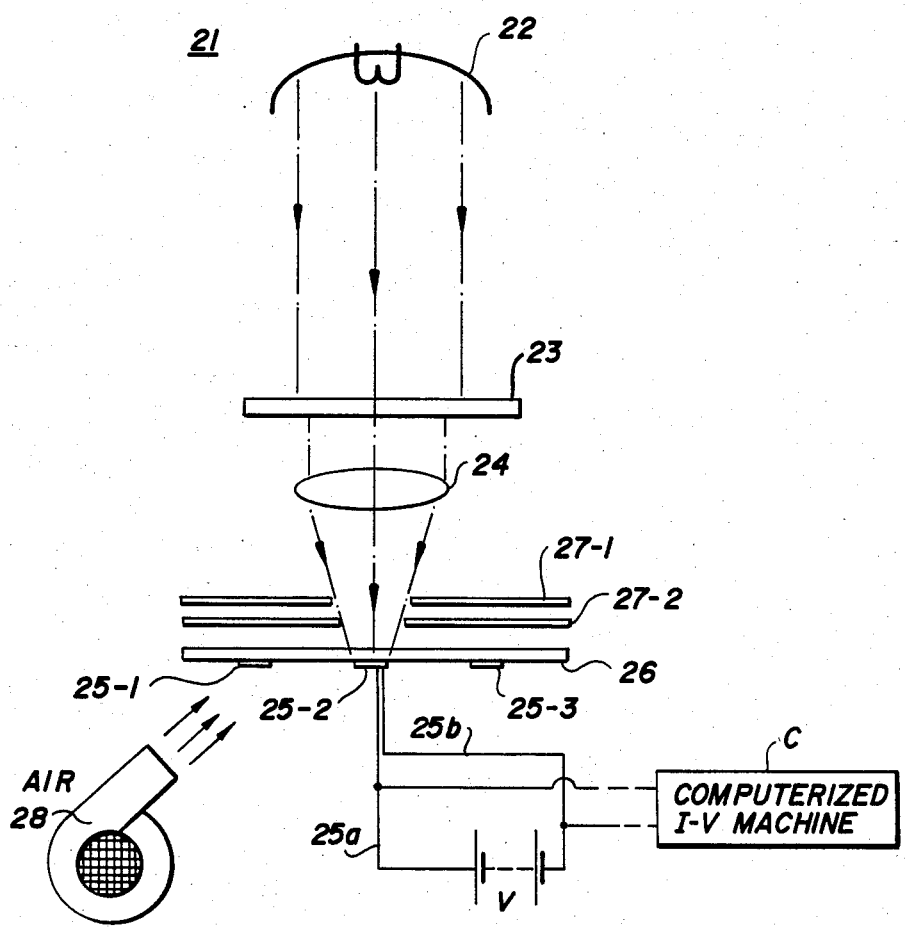
FIG. 2 is a schematic diagram of an irradiation arrangement in accordance with the invention.

In the experimental arrangement of FIG. 2, light from a tungstenhalogen lamp 21 having a dichroic reflector 22 passes through a plate 23 of heat absorbing glass, or a heat mirror, and is focused by a large diameter lens 24 onto the cell 25 under test (having an area of approximately 1/10 of a square centimeter).

Light intensities at the plane of the sample 25 of 50 to 60 suns are easily attained using such an arrangement. Test cells 25-1 through 25-3 are positioned on a sliding transparent superstrate 26 and are maintained well below the temperature range normally used for thermal annealing of cells by (a) the removal of heat (infrared light) in the incident beam by the heat absorbing glass 23, (b) by using a baffle 27-1 and aperture plate 27-2 to limit the area exposed to light to be only slightly greater than that of the test cell 25, and (c) by using a high velocity squirrel cage blower 28 to maintain a large flow of air across the surface of the superstrate 26.

The cell output leads to 25a and 25b can be connected either to a voltage source V (power supply) or a computerized arrangement C for measuring the cell's current-voltage (IV) characteristics under standard conditions (one sun and ambient temperature).

The lens 24 and heat mirror 23 can be removed under computer control in order to perform the IV measurements under standard conditions. The light source 21 is powered by a current-stabilized power supply (not shown) and the resolution and repeatability of the entire measuring system are such that small changes in cell performance can be reliably determined.

Although the method of removing defects described here (combination of electric field and intense light) is novel, and as such is independent of the underlying physical processes that serve to remove defects, it might be argued that the effects of the present invention could be attributed to thermal annealing of the sample due to a large temperature rise resulting from irradiation by a source of intense light, in spite of the cooling procedures described above.

However, careful tests have shown much smaller recoveries of cell efficiency for thermal annealing (with reverse bias) than for the method described here (reverse bias plus light) when conducted at equal cell temperatures. (The cell temperatures were determined not using a thermocouple, but using the PIN device itself as a temperature sensor based on the measured temperature coefficient of the open-circuit voltage). It is also found that the rate of recovery resulting from the application of the invention increases with increasing cell temperature. The method also removes defects in a—-Si,Ge:H, as well as other hydrogenated and fluorinated semiconductors.

Figure 3:
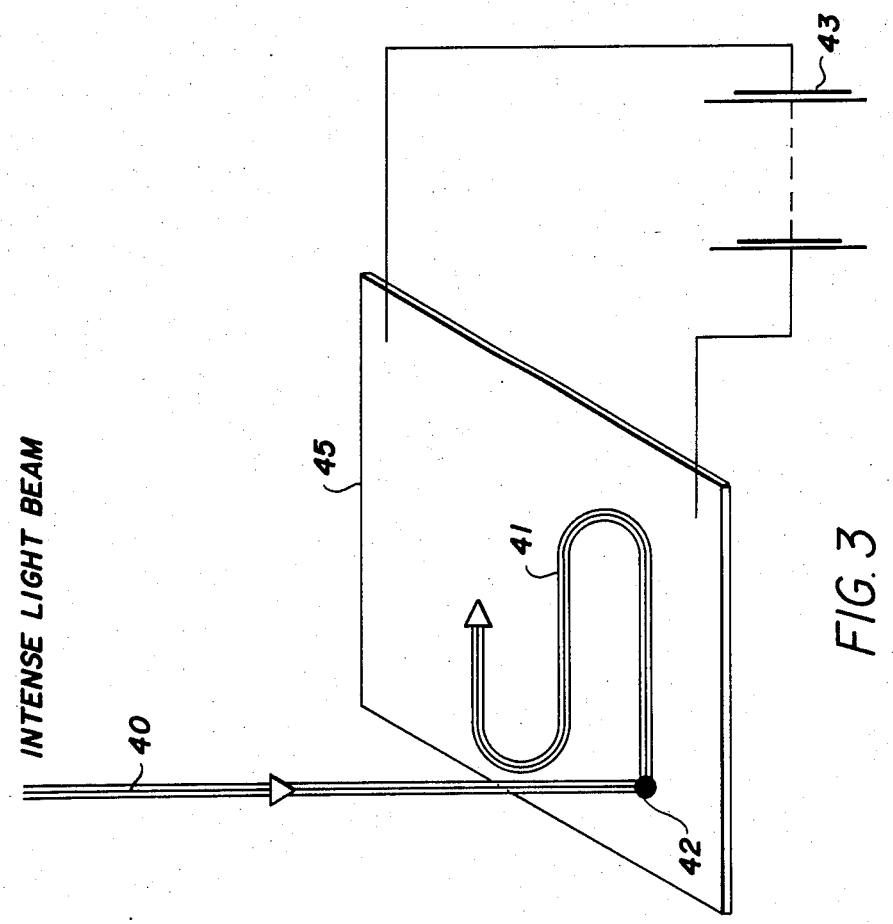
FIG. 3 is a schematic diagram of an irradiation arrangement in accordance with the invention.

FIG. 3 shows an irradiation arrangement in accordance with the invention by which an intense beam 40 of light is applied to a semiconductor plate 45 that is under reverse bias from a voltage source 43. The light beam 40 initially contacts with the plate 45 at position 42 and is moved over a serpentine path 41 in order to provide for the removal of defects in accordance with the invention.

Figure 4:
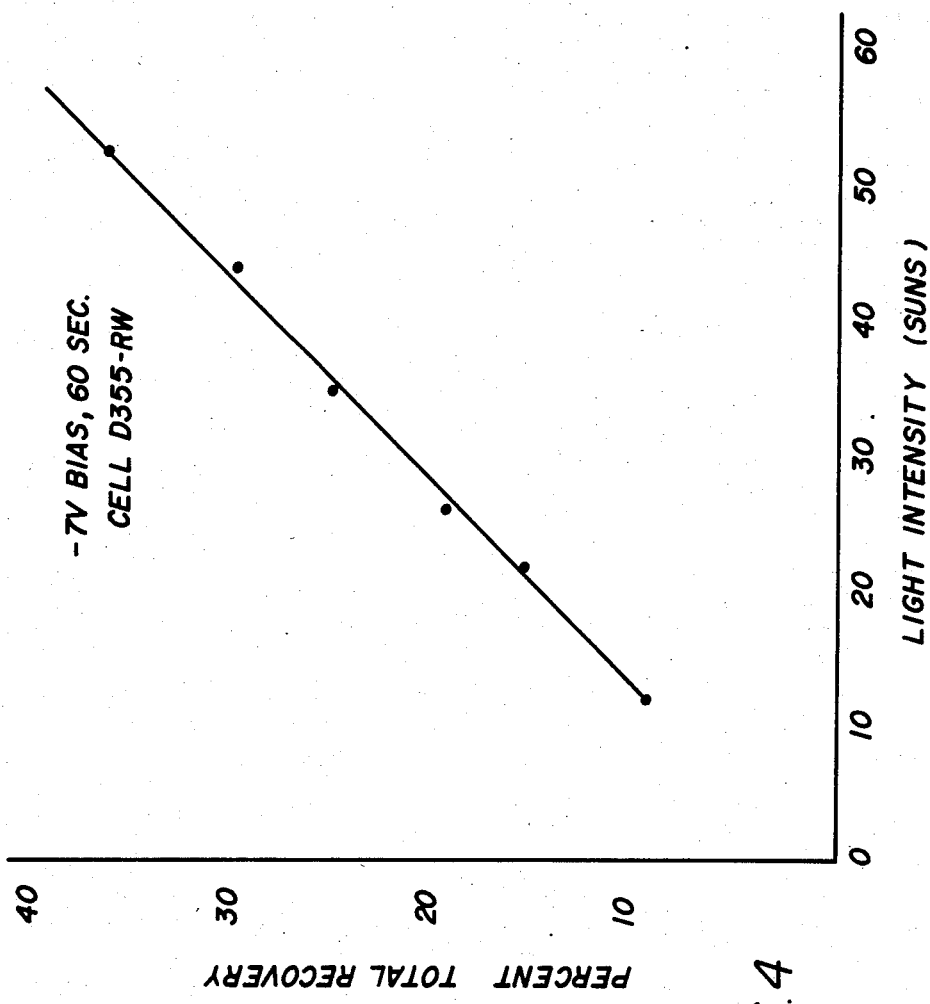
FIG. 4 is a graph of percentage recovery versus light intensity in accordance with the invention.

FIG. 4 shows that for light intensities greater than about 10 suns the percent recovery is proportional to light intensity.

Other aspects of the invention are illustrated by the Tables below.

TABLE I (Demonstration of Partial Recovery from Accelerated Deep Light Soak)

| Time (secs) | Radiation (suns) | Applied Potential (volts) | Voc (volts) | Jsc (mA/cm) | Fill Factor | Eff. (%) |
|---|---|---|---|---|---|---|
| 0 | 0 | 0 | 0.858 | 15.69 | 0.737 | 9.92 |
| 80 | 53 | 0 | 0.837 | 14.45 | 0.552 | 6.68 |
| 120 | 53 | −6.9 | 0.856 | 15.11 | 0.641 | 8.29 |
| 1,800 | 53 | −6.9 | 0.864 | 15.40 | 0.686 | 9.12 |

TABLE II (Demonstration of Full Recovery from Accelerated Medium Depth Light Soak)

| | | | | | | |
|---|---|---|---|---|---|---|
| 0 | 0 | 0 | 0.873 | 15.21 | 0.706 | 9.37 |
| 20 | 53 | 0 | 0.851 | 14.30 | 0.574 | 6.99 |
| 120 | 55 | −7.9 | 0.874 | 14.83 | 0.681 | 8.83 |
| 900 | 55 | −7.9 | 0.882 | 14.94 | 0.711 | 9.37 |

TABLE III (Demonstration of Recovery from 1 Sun Light Soak)

| | | | | | | |
|---|---|---|---|---|---|---|
| 0 | 0 | 0 | 0.845 | 14.97 | 0.711 | 8.99 |
| 16,200 | 1 | 0 | 0.840 | 13.54 | 0.562 | 6.39 |
| 120 | 55 | −5.9 | 0.856 | 14.28 | 0.684 | 8.36 |
| 1,800 | 55 | −5.9 | 0.871 | 14.42 | 0.687 | 8.63 |

I claim:

1. The method of removing defects from an amorphous semiconductor having a PIN junction therein, which comprises the steps of
    (a) applying a reverse bias potential to the semiconductor to create an electric field across said P-I-N junction; and
    (b) irradiating said semiconductor with photon energy greater than the semiconductor bandgap energy, wherein said reverse bias potential is applied before the irradiation; and
    (c) extinguishing said irradiation before removing said bias potential, thereby preventing degradation that would occur in the presence of irradiation without bias.

2. The method of claim 1 wherein the irradiation is in the visible range.

3. The method of claim 1 wherein said electric field is produced within the intrinsic (I) layer.

4. The method of claim 1 wherein the reverse bias potential is in the range from 1 to 10 volts and the radiation has an intensity in the range from 1 to 100 suns.

5. A semiconductor device stabilized by the method of claim 1.

6. The device of claim 5 wherein the semiconductor comprises amorphous silicon hydride or fluoride.

7. The device of claim 5 wherein the semiconductor comprises amorphous germanium hydride or fluoride.

8. The device of claim 5 wherein the semiconductor comprises amorphous silicon-germanium hydride.

9. The device of claim 5 including multiple PIN junctions provided by a PIN/PIN structure.

10. The device of claim 5 which is an array of interconnected, single or multiple PIN junction devices.

11. The method of claim 1 wherein the radiation is produced by a light beam which represents only a fraction of the area of the device to be treated and is scanned over the surface of the semiconductor.

12. The method of claim 1 wherein the effect is accelerated by the use of an elevated temperature below the temperature range that would in itself produce an equivalent rate of defect removal.

13. The method of claim 1 further including the step of selecting said reverse bias potential to extract photo-generated carriers at a rate which reduces their recombination within the intrinsic layer of the PIN device.

14. Apparatus for removing defects from an amorphous PIN semiconductor which comprises:

means for applying a reverse bias potential to said semiconductor;

means for illuminating the reverse-biased semiconductor; and means for removing infra-red energy from the energy illuminating said semiconductor.

* * * * *